(12) United States Patent
Weichart

(10) Patent No.: US 8,778,144 B2
(45) Date of Patent: Jul. 15, 2014

(54) METHOD FOR MANUFACTURING MAGNETRON COATED SUBSTRATES AND MAGNETRON SPUTTER SOURCE

(75) Inventor: Jurgen Weichart, Balzers (LI)

(73) Assignee: Oerlikon Advanced Technologies AG, Balzers (LI)

(*) Notice: Subject to any disclaimer, the term of this patent is extended or adjusted under 35 U.S.C. 154(b) by 1084 days.

(21) Appl. No.: 10/952,331

(22) Filed: Sep. 28, 2004

(65) Prior Publication Data

US 2006/0065525 A1   Mar. 30, 2006

(51) Int. Cl.
| C23C 14/00 | (2006.01) |
| C23C 14/32 | (2006.01) |
| C25B 9/00  | (2006.01) |
| C25B 11/00 | (2006.01) |
| C25B 13/00 | (2006.01) |

(52) U.S. Cl.
USPC ............ 204/192.12; 204/192.1; 204/298.17; 204/298.19; 204/298.2

(58) Field of Classification Search
USPC ............ 204/192.12, 192.15, 298.2, 298.13, 204/298.16, 298.17; 427/10
See application file for complete search history.

(56) References Cited

U.S. PATENT DOCUMENTS

| 4,311,725 | A | * | 1/1982 | Holland ........................ 427/10 |
| 5,126,028 | A | * | 6/1992 | Hurwitt et al. ........... 204/192.13 |
| 5,374,343 | A | * | 12/1994 | Sasaki et al. ............... 204/298.2 |
| 5,399,253 | A |   | 3/1995 | Grunenfelder |
| 5,855,744 | A | * | 1/1999 | Halsey et al. ............ 204/192.12 |
| 6,451,177 | B1 | * | 9/2002 | Gopalraja et al. ....... 204/192.12 |
| 6,464,844 | B1 | * | 10/2002 | Pichulo et al. ........... 204/192.15 |
| 6,709,557 | B1 | * | 3/2004 | Kailasam et al. ........ 204/298.13 |
| 7,115,194 | B2 | * | 10/2006 | Iseki ........................... 204/298.2 |
| 7,674,360 | B2 | * | 3/2010 | Hong et al. ................ 204/298.2 |
| 2004/0050690 | A1 |   | 3/2004 | Green et al. |
| 2005/0279624 | A1 | * | 12/2005 | Brcka ..................... 204/192.12 |

FOREIGN PATENT DOCUMENTS

| DE | 39 08 252 A1 | 9/1990 |
| DE | 3908252 | 9/1990 |
| EP | 0 820 088 A2 | 7/1997 |
| EP | 0 858 095 A2 | 2/1998 |
| EP | 0 858 095 A3 | 2/1998 |
| EP | 0 945 524 A1 | 2/1999 |
| JP | 01152270 A * | 6/1989 |
| JP | 01309965 A * | 12/1989 |
| JP | 07166346 A * | 6/1995 |
| JP | 09143713 A * | 6/1997 |
| JP | 2001158961 A * | 6/2001 |
| WO | WO 98/02597 | 1/1998 |
| WO | WO 2004/036616 A1 | 4/2004 |

OTHER PUBLICATIONS

Machine Translation—JP 2001158961.*
Machine Translation—JP 09143713.*
Translation JP2001158961.*
Translation JP09143713.*

* cited by examiner

*Primary Examiner* — Michael Band
(74) *Attorney, Agent, or Firm* — Notaro, Michalos & Zaccaria P.C.

(57) ABSTRACT

Method for manufacturing magnetron coated substrates, in which along the target and on its backside pointing from the substrate, a magnet arrangement is present by which along the sputter surface of the target at least one closed loop of a tunnel shaped magnetron magnetic field is generated, characterized in that for setting the sputter rate distribution the distance of a part of the magnet arrangement to the backside of the target is changed.

10 Claims, 16 Drawing Sheets

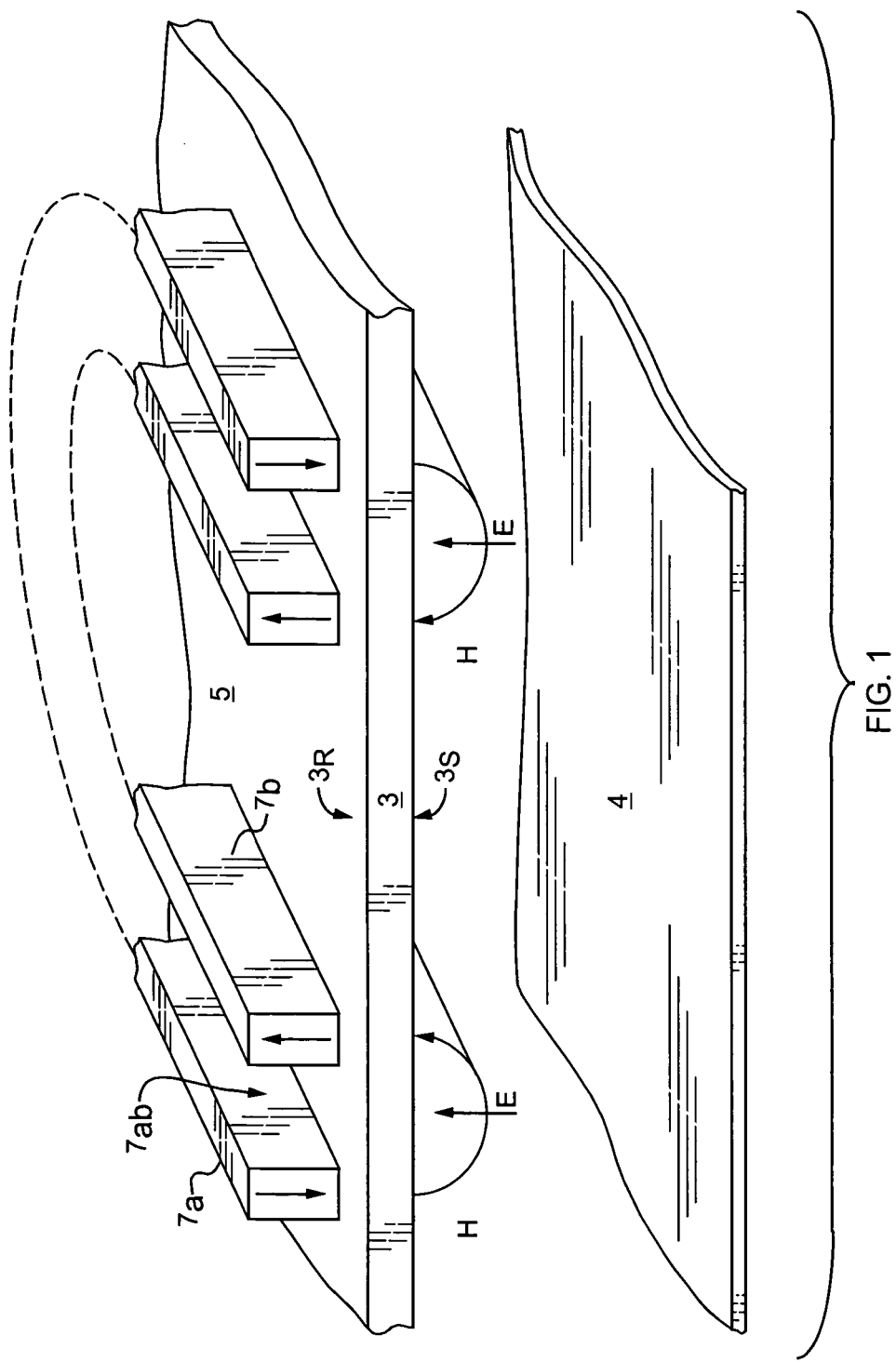

Figure 2A:
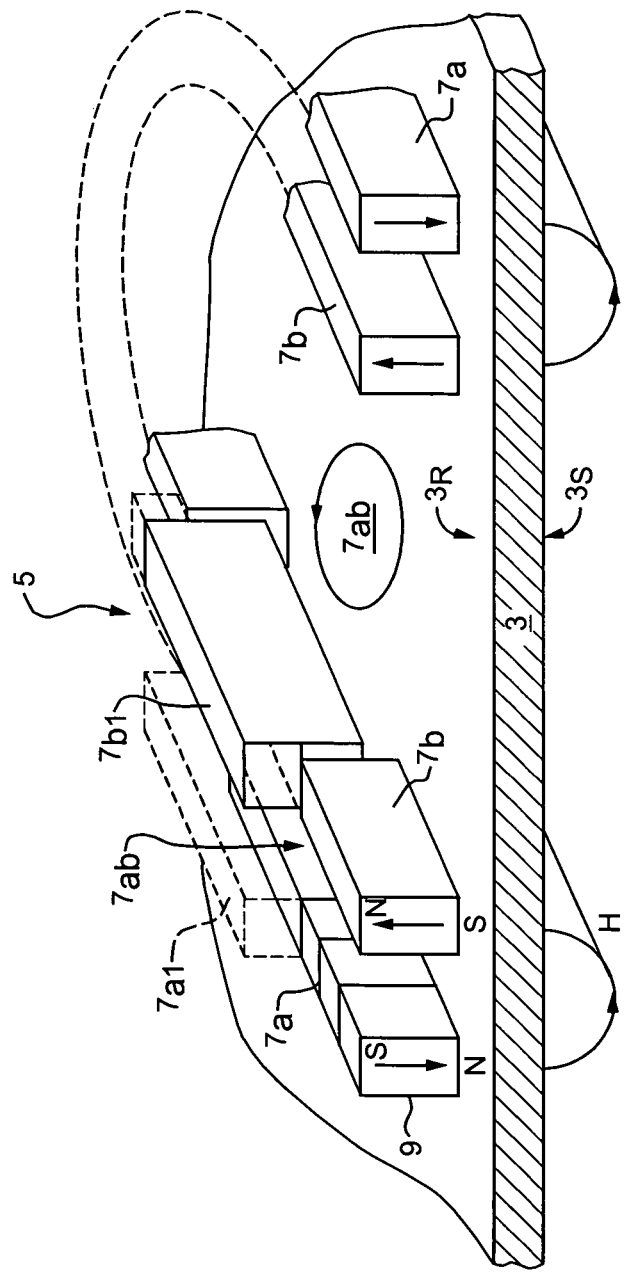

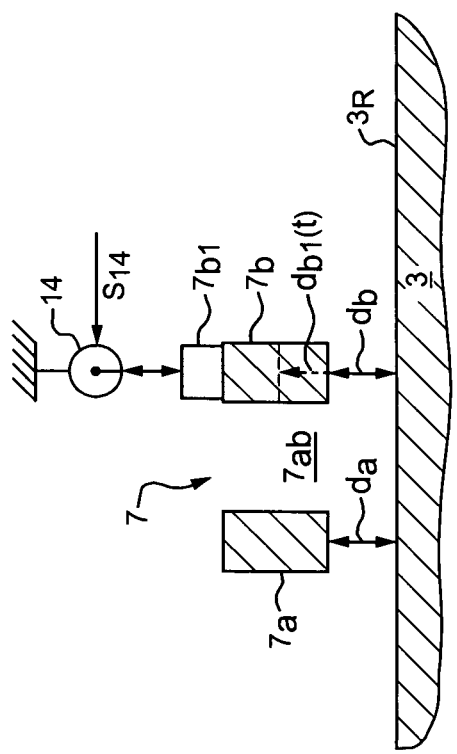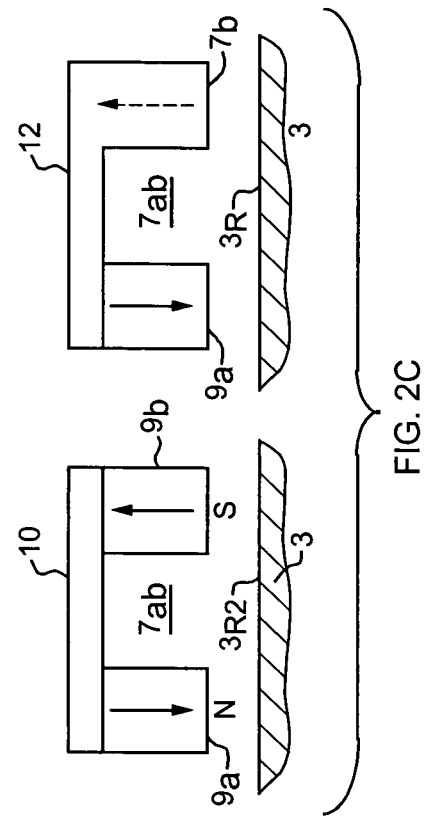
FIG. 2B
FIG. 2C

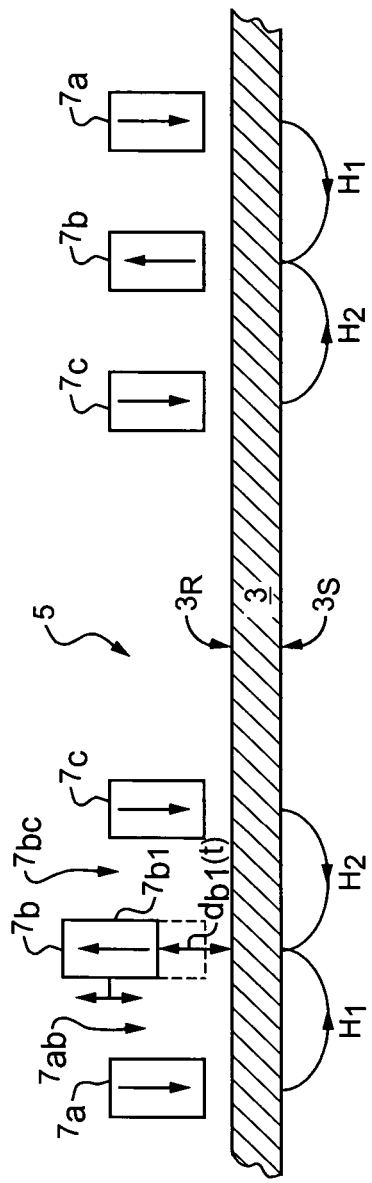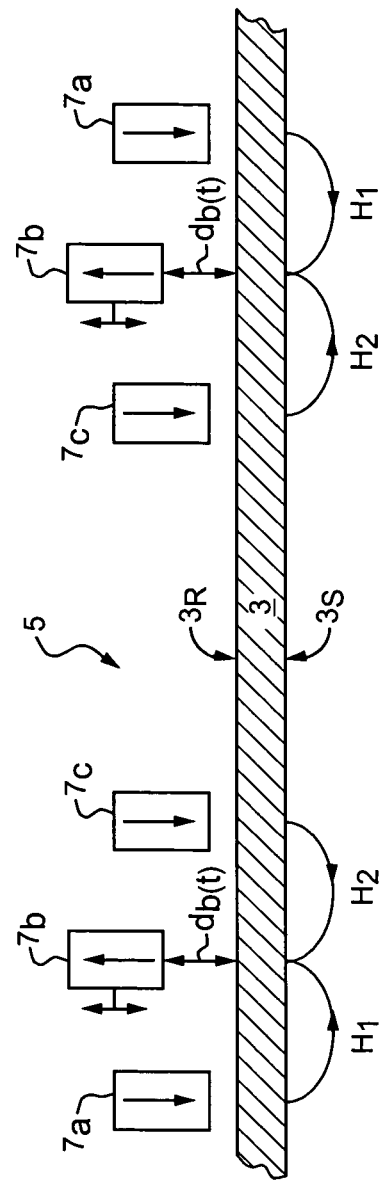
FIG. 4
FIG. 5

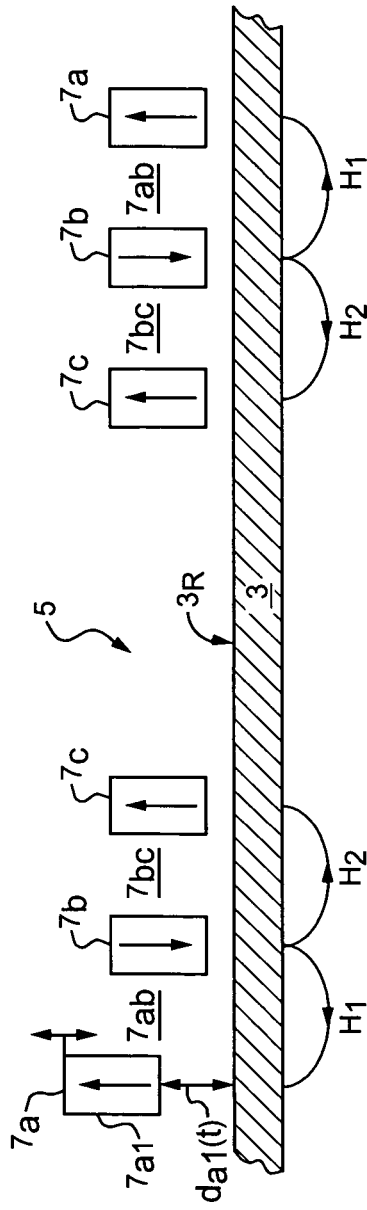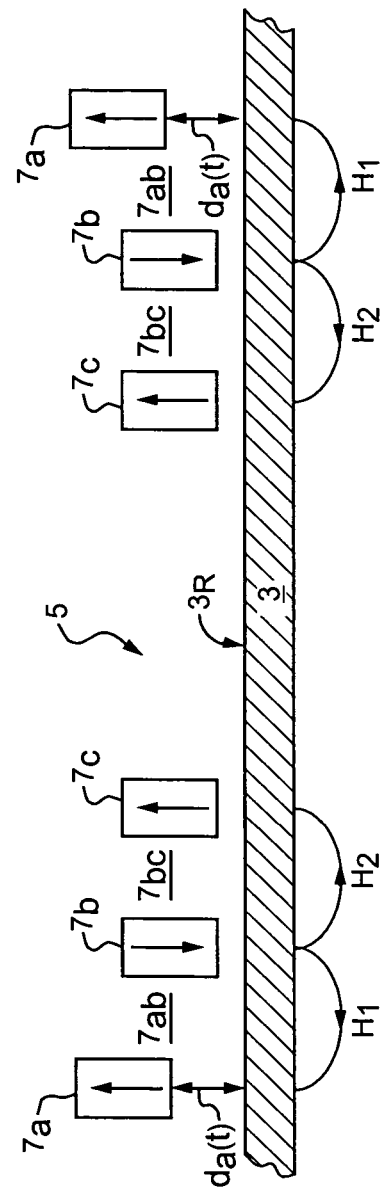

METHOD FOR MANUFACTURING MAGNETRON COATED SUBSTRATES AND MAGNETRON SPUTTER SOURCE

The present invention relates to a method for manufactoring magnetron coated substrates and a magnetronsource.

DEFINITIONS

The construction of a magnetronsource is schematically illustrated in FIG. 1. It has a target 3 with a sputter surface $3_s$ from which target material is sputtered off and reactively or not reactively deposited on the substrate 4.

On the back side $3_R$ of the target 3 a magnet arrangement is provided. It has at least one pair of circumferential magnet loops $7_a$ and $7_b$ which facing the back side $3_R$ of the target 3 have surfaces of inverse magnetic polarity. The magnet loops $7_a$ and $7_b$ are each forming closed loops, wherein "closed" absolutely also includes magnets which are arranged a distance apart from one another, as long as by both magnet loops $7_a$ and $7_b$ closed loops of the magnetron magnetic field H are generated at the sputter surface $3_S$. With reference to the generation of the circumferential tunnel shaped magnetron magnetic field both magnet loops $7_a$ and $7_b$ are forming a pair of interacting magnet loops $7_{ab}$. The magnetron magnetic field H is, as shown schematically, crossed by an electric field E generated between the anode and the target 3 interconnected as the cathode. Due to the magnetron magnetic field H and the electric field E the known electron trap effect in the area of the tunnel shaped magnetron magnetic field H occurs, what there leads to an increased plasma density and an increased sputter effect. The result is, in the area of the magnetron magnetic field H, an over the operation time increasing deeper circumferential erosion trench in the sputter surface $3_s$.

We call a closed, however formed, loop of magnets, which is presenting to the back side $3_R$ of the target 3 one of both magnetic polarities, a magnet loop. According to FIG. 1 two of such magnet loops $7_a$ and $7_b$ are present. Two such magnet loops which are joining each other are forming a pair of magnet loops according to $7_{ab}$ of FIG. 1 if they generate a circumferential loop of the tunnel shaped magnetron magnetic field H. The magnet arrangement 5 can contain one ore more circumferential magnet loops beside for forming the magnetron magnetic field separately positioned additional magnets loops. The electric field E between the (not shown) anode and the target cathode can by DC, pulsed DC, superposed DC and AC and AC be generated up to the high frequency range. As mentioned the coating process may be performed with the one or the several target materials, or after their reaction with a reactive gas inserted in the process space between the sputter surface $3_s$ and the substrate 4. On one and the same target 3 with areas of different materials simultaneously several materials can be sputtered into the process space, directly for coating or after reaction with a reactive gas within the process space. In order to extend the life time of the target 3 and/or to keep the sputter rate (amount of off-sputtered material per time unit) despite the forming of the erosion trench or trenches e.g. constantly and therewith the coating rate (amount of material deposited at the substrate 4 per time unit) it is known and common to move at least parts of the magnet arrangement 5, thereby in particular the one or the several provided pairs of magnet loops along the backside of the target, be it by cyclic linear movements or rotational movements or pendulum movements. Therewith the magnetron magnetic field is moved along the sputter surface to generate preferably no significant local erosion trenches.

We call a magnetronsource a one circuit source if it has only one pair of magnet loops. We call a magnetronsource a two or multi circuit source if the magnet arrangement has two or more pairs of magnet loops. It is to be noticed that absolutely with three magnet loops two pairs of magnet loops can be formed. The present invention now emanates from a method for generating magnetron coated substrates, in which along the target of which backside pointing from the substrate, a magnet arrangement is provided by means of which along the sputter surface of the target, at least one closed loop of a tunnel shaped magnetic field is generated. It is a notorious problem particularly in the application of large surface targets to achieve at the sputter coated substrate or substrates a volitional distribution of the layer thickness and to retain it over the time. Thereby one of the problems exists therein, that because of the target erosion the coating circumstances are dynamical i.e. change during the life time and the employment time respectively of the targets. If during the life time of a considered target a lot of substrates are coated then the mentioned dynamic according to the coating time of the individual substrates eventually has only a small effect thereon whereas then, when the layer thickness distribution is considered over the whole target life time, as if only one individual substrate would be coated, often a significant change in the distribution of the layer thickness is observed.

Definition

We define as the coating time a considered time period up to the life time of the target, independent therefrom how many individual substrates are coated with the same target in the considered time period. Rotating one circuit magnetronsources with heart or meander shaped magnet loops structures cover the largest part of the applications in the field of magnetron sputtering.

Adjustable one circuit magnetronsources for the distribution optimization of the sputter rate over the coating time are described e.g. in U.S. Pat. No. 5,188,717. Statical two circuit magnetronsources are e.g. known from WO 98/03696 or U.S. Pat. No. 5,997,697. Two circuit magnetronsources with switching mechanism, in order to switch from sputters through one of the pairs of magnet loops to sputters at a second are described in WO 01/63643.

Because of the limited coverage of large target surfaces e.g. of 1200 cm² it is often very difficult to achieve by means of rotating one circuit magnetronsources a desired uniform distribution of the sputter rate, of the coating rate and finally of the layer thickness at the substrate over the coating time. Thereby often meander- or heart shaped structures of the pair of magnet loops are employed, which however on large target surfaces posses the disadvantage that they either have several turning points or over lift wide areas of the targets only insufficiently. In particular narrow radii of the pairs of magnet loops lead furthermore at increased speeds, like the revolution number of the magnetic system, to high losses of eddy-current. These are on the one hand to be compensated by the engine power and lead on the other hand to a weakening of the magnetron magnetic field. Static two circuit magnetronsources, as described within WO 98/03696 or U.S. Pat. No. 5,997,697, have the disadvantage that statically erosion profiles are impressed into the sputter surface. As initially mentioned it appears above all, that with increasing off-sputtering of the target the sputter rate, the coating rate and therewith also the layer thickness distribution at the substrate change. Therefore, basically a mechanism is required which enables an setting primary of the sputter rate distribution at the target and over which life time. This is often solved such that magnet groups of the magnet arrangement are displaced laterally, i.e. along the back side $3_R$ of the target 3, as known for instance from WO 02/47110. Adversarial at this is, that to the rotating system with the pairs of magnet loops another drive has to be superposed for which energy supply e.g. over electrical collecting rings must be implemented. By displacing the mentioned magnet groups unbalances occur which have to be compensated by appropriate measurements. Rotating two-circuit magnetronsources with a switching mechanism for selective activation of the one or the other pairs of magnet loops, as described in WO 01/63643 involve a too high strain of the electromechanical drives. It is a task of the present invention to suggest a method of the initially mentioned type and a magnetronsource respectively at which and whereon respectively during the sputter operation—the coating time—the sputter rate distribution along the sputter surface can be set in situ and thereby the disadvantages of known methods and magnetronsources respectively with approaches referring to this are avoided. Concerning this the method of the initially mentioned type is according to the invention thereby distinguished, that for the setting of the sputter rate distribution the distance of a part of the magnet arrangement to the back side of the target is changed. A good realization of this method results furthermore there from that at least a part of the magnet arrangement of the target is moved along the back side of the target. Thereby a distribution of the sputter effect of the tunnel shaped magnetron magnetic field along the sputter surface results.

A further good realization of the method according to the invention exists therein, that a part of a circumferential magnet loop is distance-changed. Therewith results a change of the sputter intensity in the area of the magnetron magnetic field co-generated with the loop.

A further good realisation exists therein that the distance of a whole magnet loop is changed eventually combined with a change of a part of the considered or another magnet loop.

A further good realisation exist therein that eventually combined with the previously mentioned realisations the distance of a whole pair of magnet loops is changed, above all indicated, if the magnetronsource is a two or multi circuit source. Then the corresponding distances can be changed also at more than one of the pairs of magnet loops.

Shall the setting according to the invention of the mentioned distance be realized at magnetronsources at which the magnet arrangement is rotated along the back surface of the target and shall a homogenous layer thickness distribution during the coating time up to the target life time be achieved, then a good realisation exists therein to with increasing coating time increase the distance of a part of the magnet arrangement which is closer at the target edge as a further part of the magnet arrangement and/or to decrease the distance of the further part. In all mentioned realizations it is further good to keep the sputter power constant. A further good idea it is to, at a constantly kept sputter power, determine the discharge voltage between an anode and the target, to compare it with a target value and in function of the comparison result set the distance of the part. Furthermore it is also a good idea to divide the target into zones of different materials and to set the ratio of the sputter rates of the both material by the mentioned distance setting. A magnetronsource according to the invention has a target with a sputter surface and, along the backside of the target pointing from the sputter surface, a magnet arrangement. The above mentioned task is solved at it thereby, that the distance of a part of the magnet arrangement to the back surface of the target is adjustable by means of a controlled lift drive. It is a good concept of the magnetronsource according to the invention, that at least one part of the magnet arrangement is operatively connected with a movement drive by means of which the part is moved along the back surface of the target. It is a further good, with the mentioned offhand combinable concept, if a part of a magnet loop is operatively connected with the controlled lift drive. A further good idea for the concept of the magnetronsource according to the invention, eventually combined with the previously mentioned, exists therein, to set a whole magnet loop by the mentioned controlled lift drive. This concept can also eventually with the previously mentioned be combined, just as well as the good further concept to operatively connect a pair of magnet loops with the controlled drive. A good further concept exists therein to provide at the source and with respect to the back surface of the target an outer pair of magnet loops and an inner pair of magnet loops and to design eccentrically with respect to an axis of rotation and to operatively connect with a rotation drive acting relatively to the axis of rotation at least one of the pairs of loops. It is a further good idea, to provide a control by means of which the distance of a part of the magnet arrangement, which is positioned further outside (S.9, Z.12) at the target than another part of the magnet arrangement, during the coating time is increased and/or the distance of the further part is decreased. The invention is subsequently elaborated on by means of examples and with the aid of figures which are showing:

FIG. 1 is a schematic exploded view of the construction of a magnetronsource, positioned over a substrate to be treated.

Figure 3:
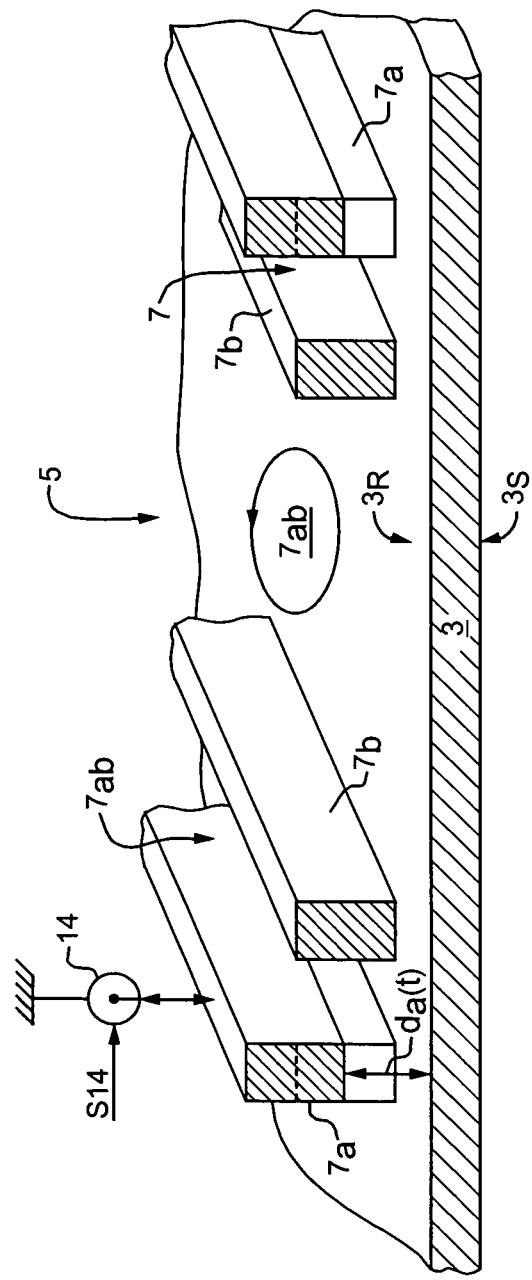
Figure 8:
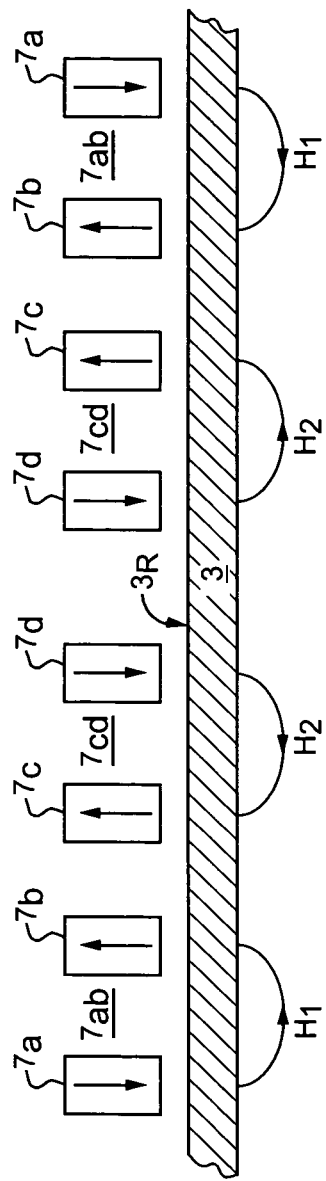
Figure 9:
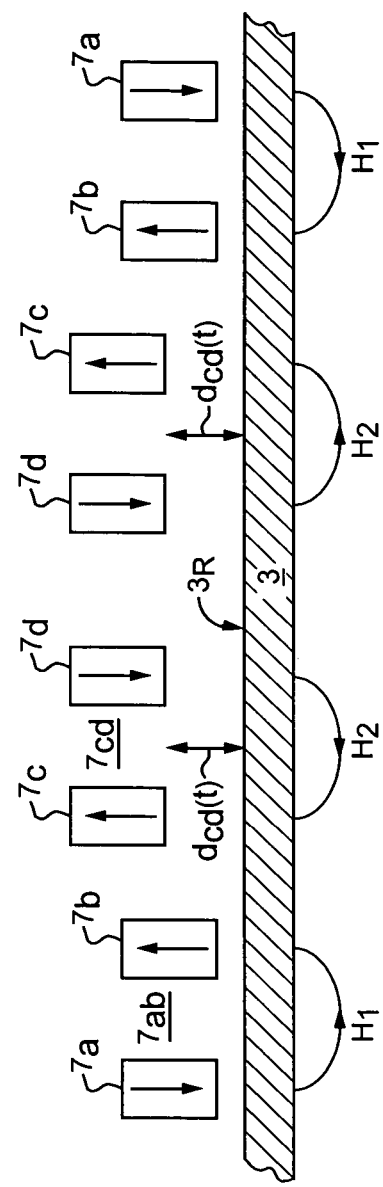
Figure 10:
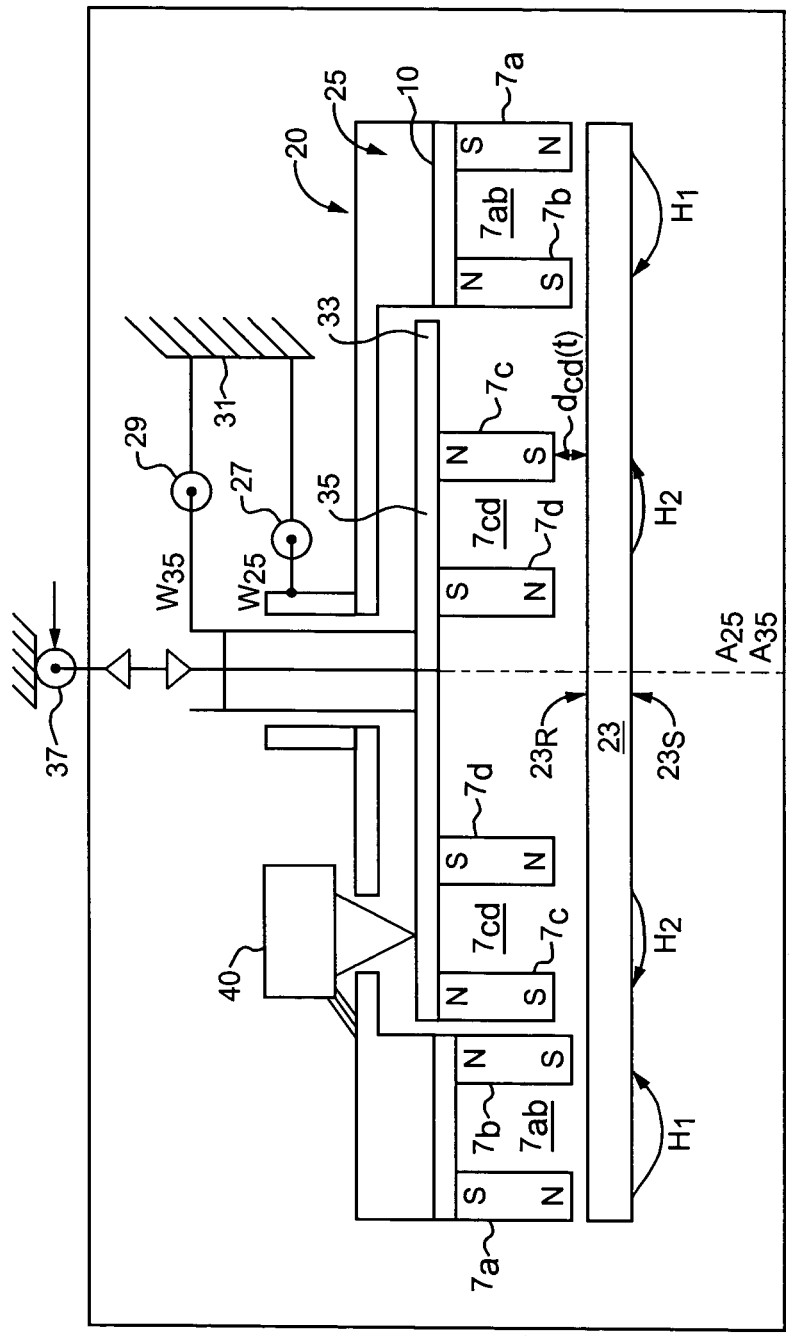
Figure 11:
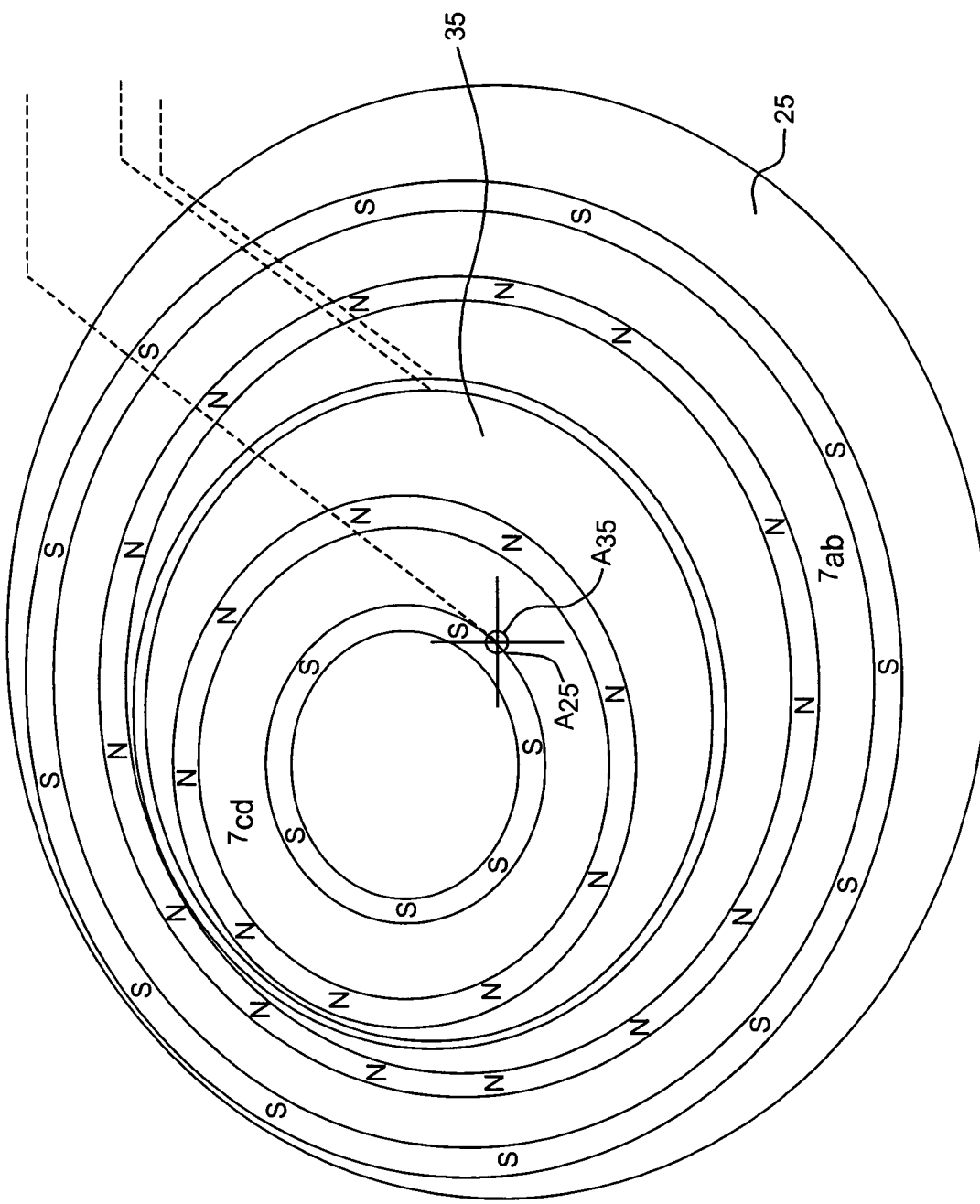
Figure 12:
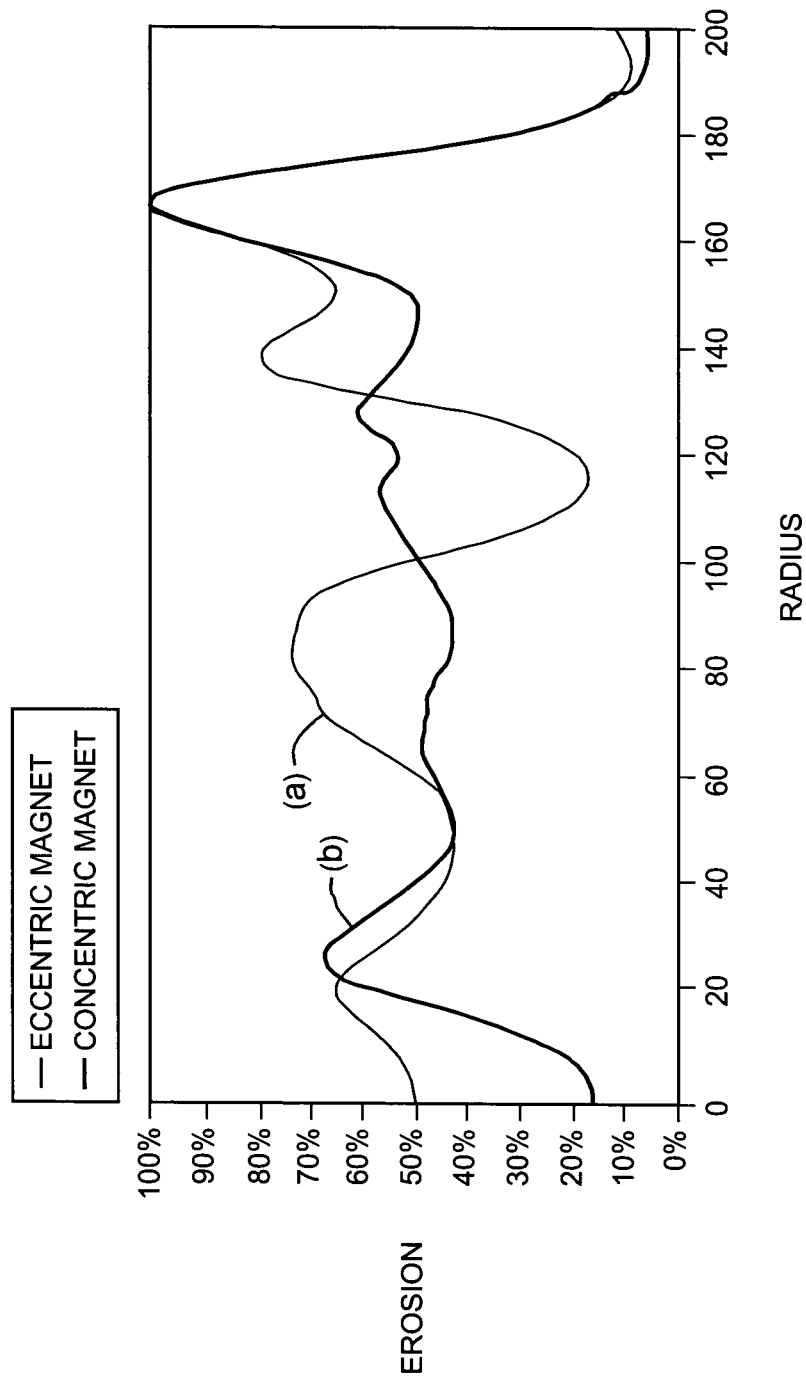
Figure 13:
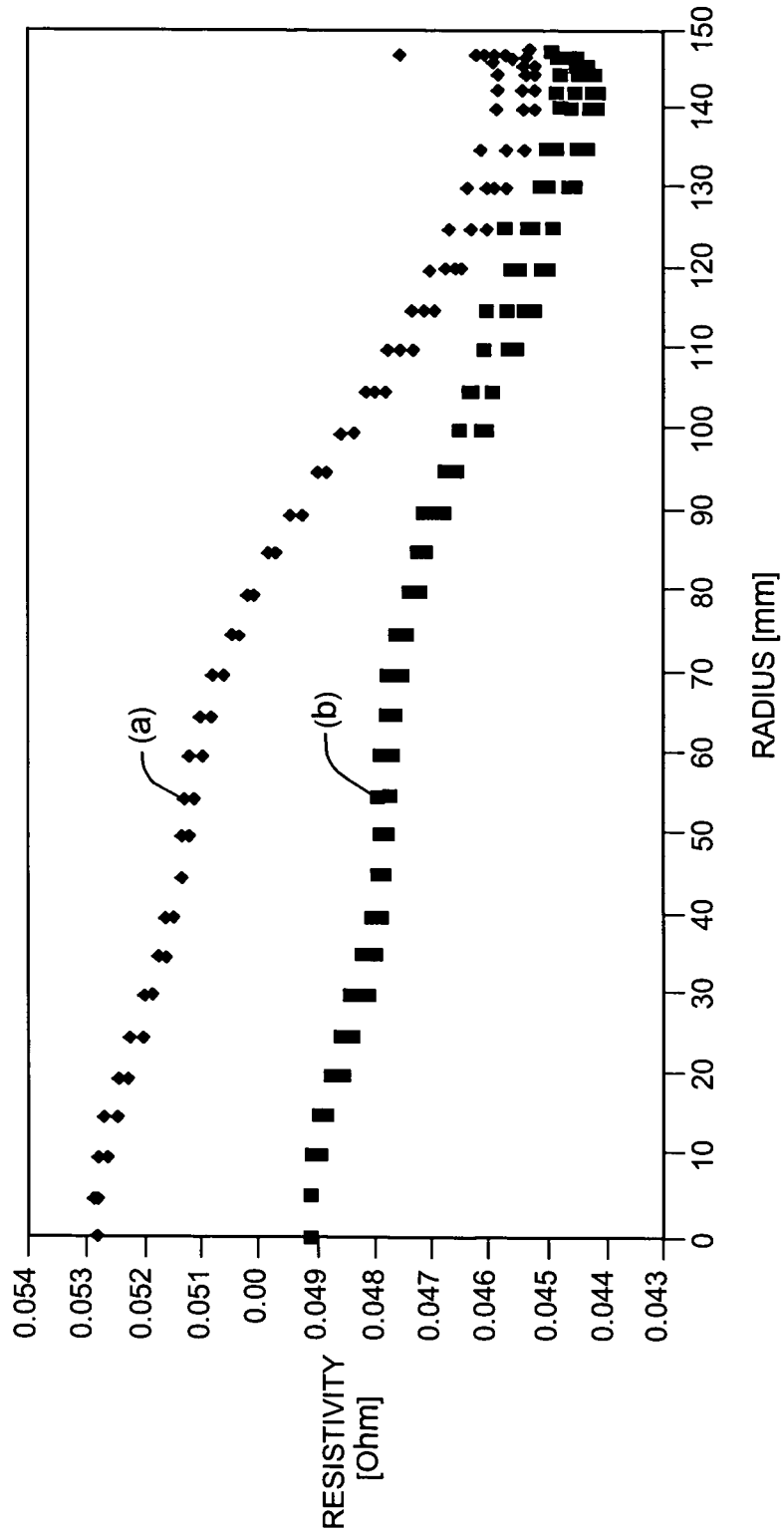
Figure 14:
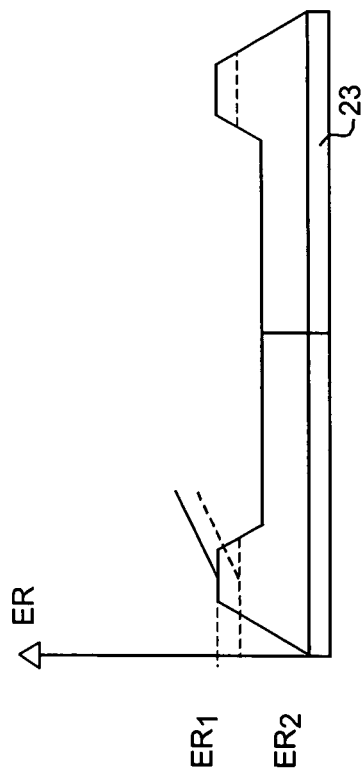
Figure 15:
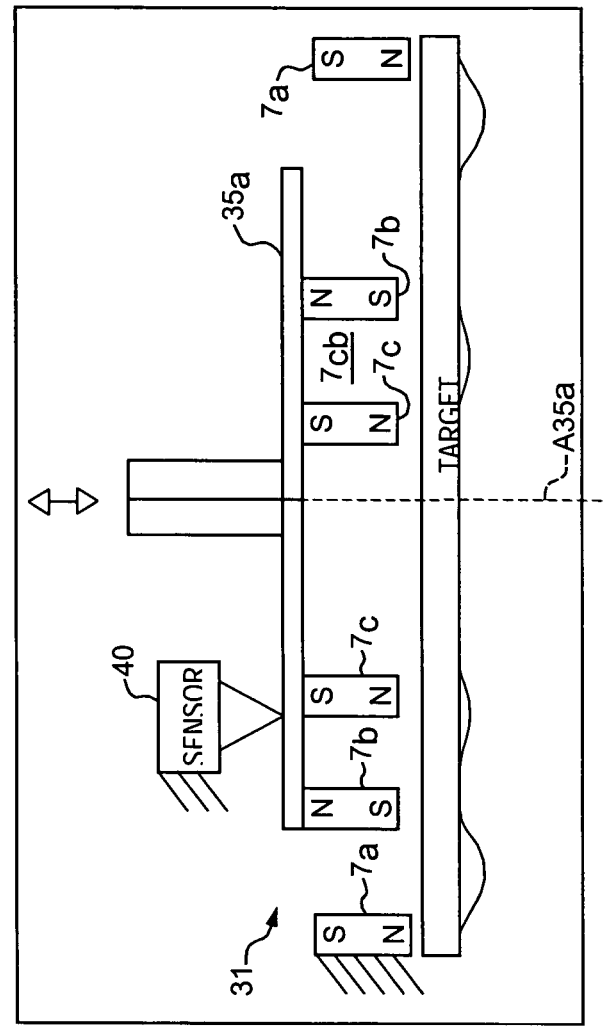
Figure 16:
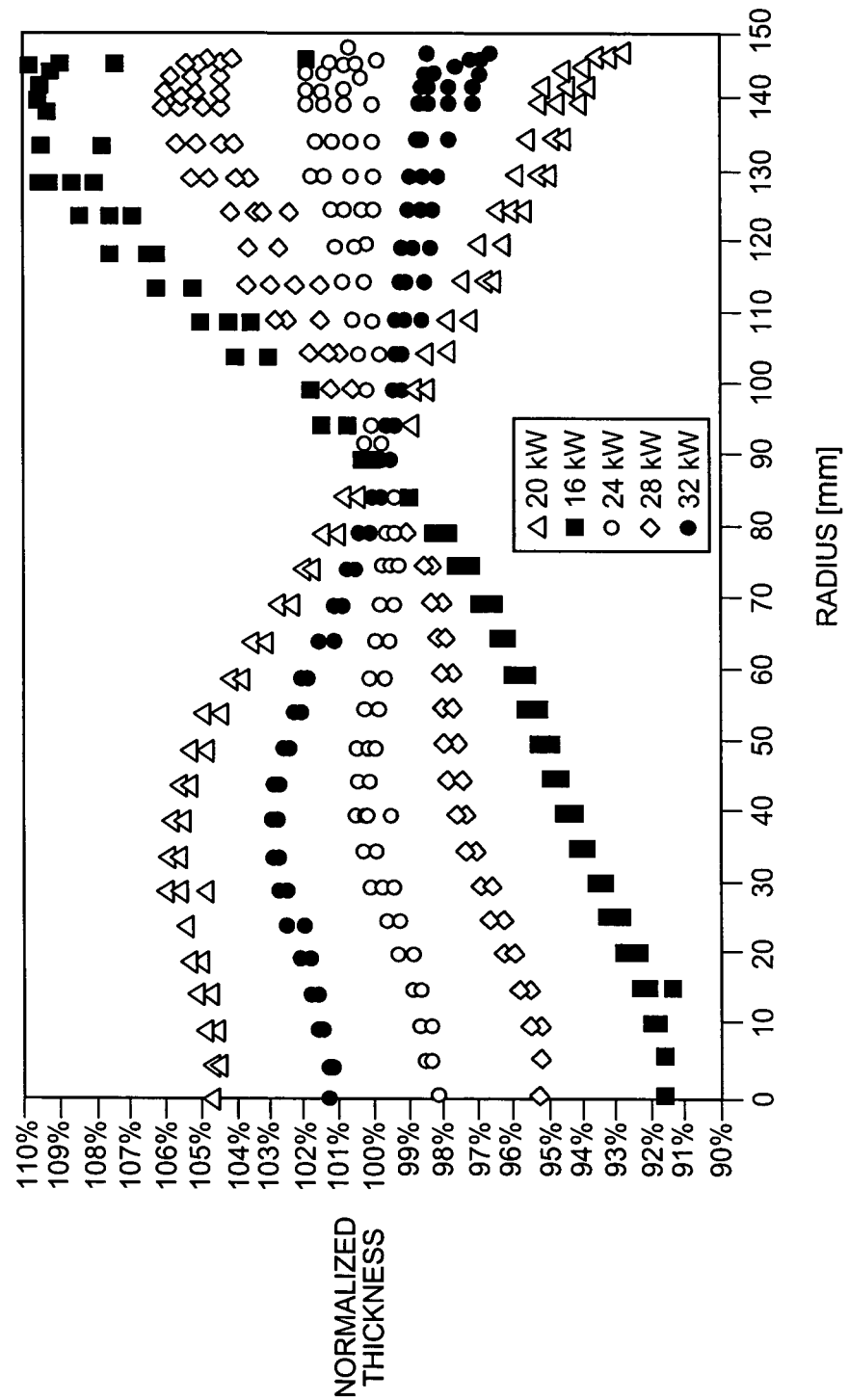
Figure 17:
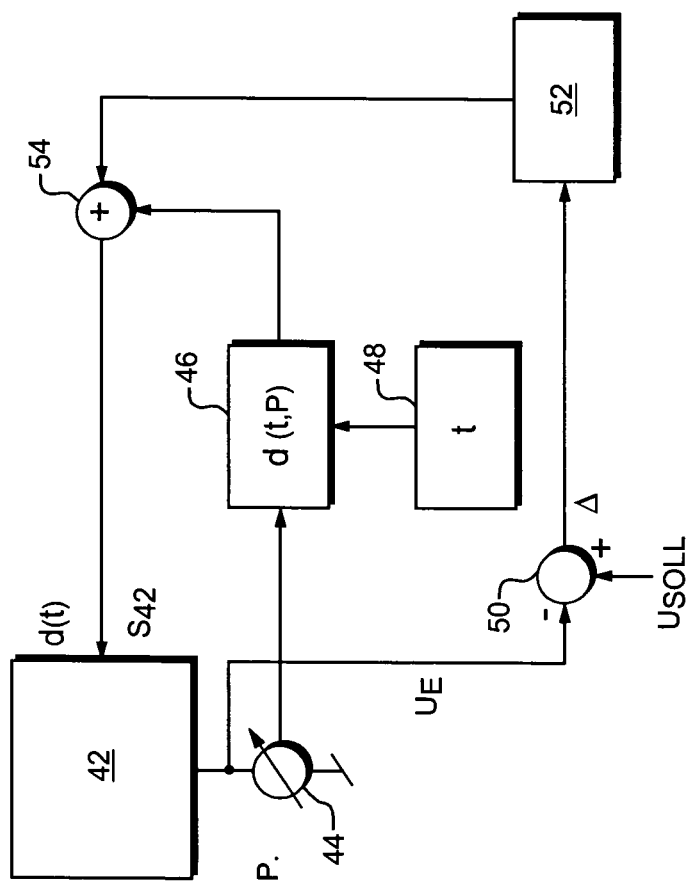
Figure 18:
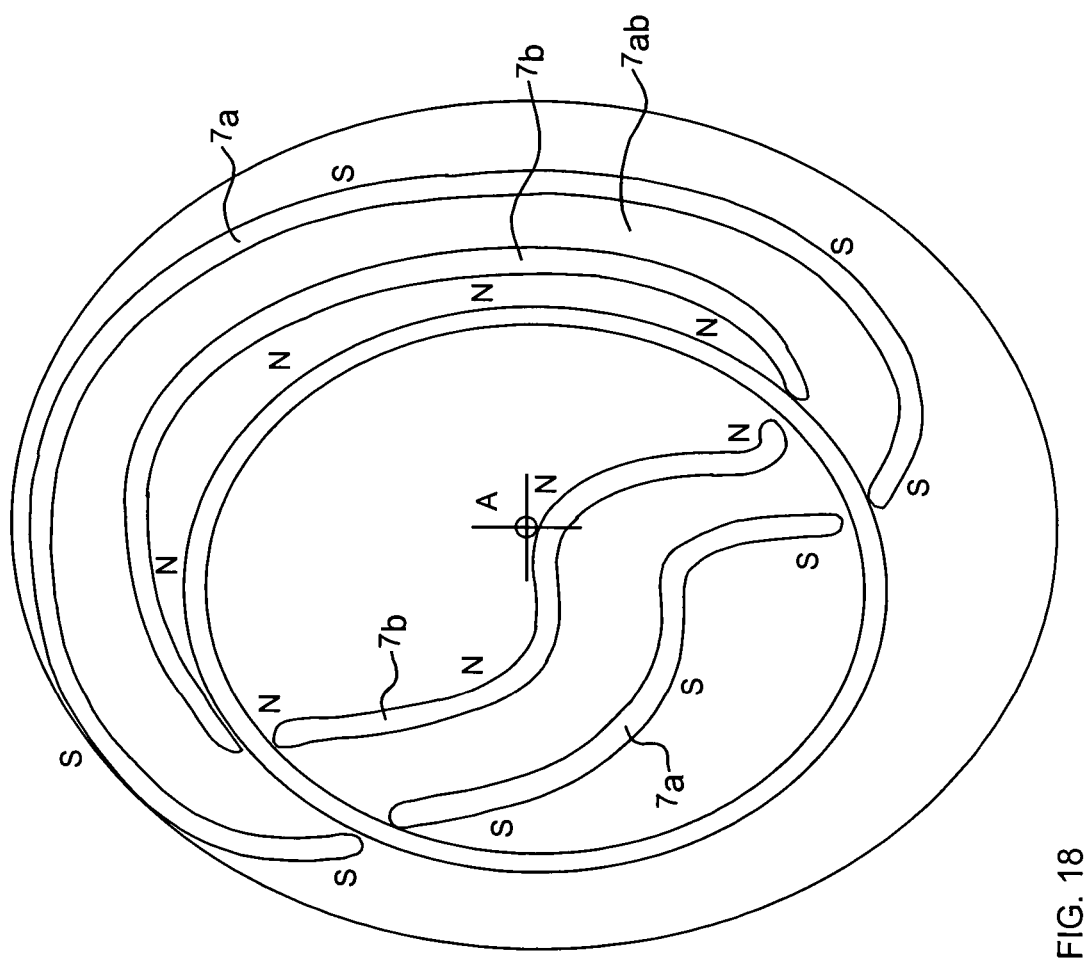
Figure 19:
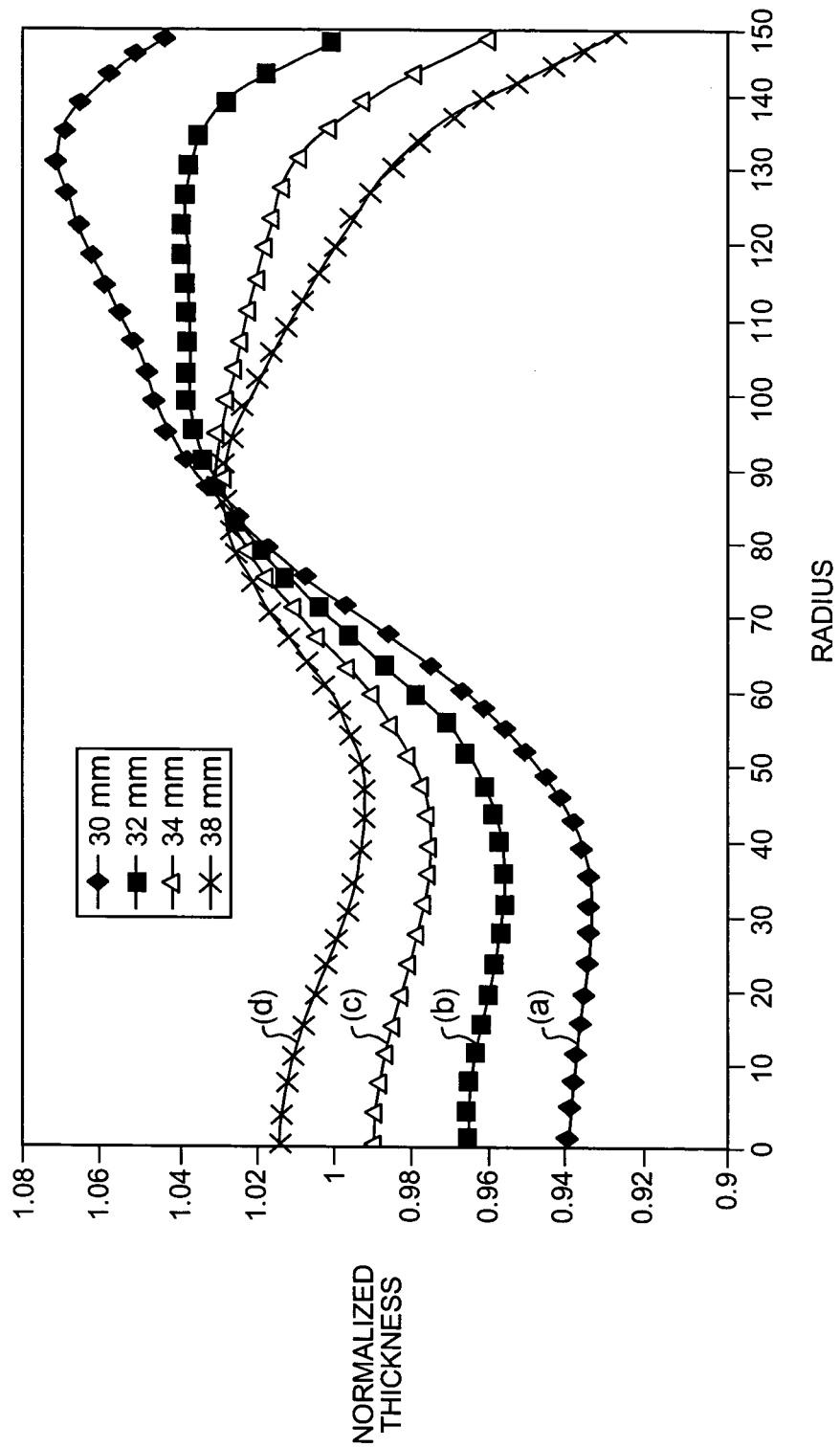

FIG. 2a schematically a perceptive view of a first embodiment of the method according to the invention and a magnetronsource according the invention respectively, FIG. 2b furthermore schematically a side view on the arrangement shown in FIG. 2a, FIG. 2c furthermore schematically two variants of the magnet arrangement, e.g. at an arrangement according to FIG. 2a, for the formation of the magnetron field, FIG. 3 in a presentation analogous to that of FIG. 2a a further embodiment of the invention, FIG. 4 in a view analogous to that of FIG. 2b schematically a further embodiment of the invention, FIG. 5 in a presentation analogous to that of FIG. 4 a further embodiment of the invention, FIG. 6 furthermore in a presentation analogous to that of FIGS. 4 and 5 respectively a further embodiment of the invention, FIG. 7 furthermore in a presentation analogous to that according to FIGS. 4 to 6 yet a further embodiment of the invention, FIG. 8 in a presentation analogous to that of FIGS. 4 to 7 a further magnet loop arrangement at which precautions, as being described by means of the FIGS. 2 and 3, are realized, FIG. 9 furthermore in the mentioned presentation a further embodiment of the invention, FIG. 10 schematically a realization form of a sputter source according to the invention conceived in principal according to the realization variant of FIG. 9, FIG. 11 a top view of a magnet arrangement employed according the invention, FIG. 12 the course (a) of an erosion profile at a circular target at the arrangement according to FIG. 10, at a concentrically pair of magnet loops and an eccentric, and the course (b) at eccentric arrangement of both pairs of magnet loops without setting of the magnetic lift;

FIG. 13 layer thickness distribution courses (a, b) at different set lifts,

FIG. 14 schematically an erosion profile at a circular disc shaped target for the discussion of an erosion profile to be aspired, FIG. 15 in a presentation analogous to that of FIG. 10 an arrangement according to the invention in an embodiment in principal according to FIG. 7, FIG. 16 the standardized layer thickness distribution at a substrate with sputter power as parameter, FIG. 17 schematically a signal flow/function block chart of an embodiment for the electrical guidance of the magnetron-source according to the invention, FIG. 18 for instance in top view simplified, the magnet arrangement at a one circuit magnetronsource according to the invention, FIG. 19 the layer thickness distribution resulting by the magnet arrangement according to FIG. 18 in function of the distance setting In FIG. 2a a first embodiment of the method according to the invention and the magnetronsource according to the invention respectively is illustrated in schematized perspective view, furthermore in FIG. 2b is schematized the side view on the arrangement illustrated in FIG. 2a. On the substrate side (substrate not shown) target 3 has a sputter surface $3_s$ and, pointing from the substrate, a back side $3_R$. In the area of the back surface $3_R$ a magnet arrangement is present, which generates at least one, according to the FIG. 2 one, closed loop of a tunnel shaped magnetic field H at the sputter surface $3_S$, the magnetron magnetic field absolutely familiar for a person skilled in the art. In the FIG. 2 a common one circuit magnetronsource is shown. For this the magnet arrangement 5 has a first basically closed circumferential magnet loop 7a as well as a second 7b which is located inside the firstly mentioned. At least the one of the both magnet loops 7a, 7b is at least to the greatest extent constructed by means of permanent magnets 9, for instance according to the FIG. 2 the outer magnet loop 7a. The mentioned e.g. outer magnet loop 7a is with the one magnetic polarity—for instance N—located opposite to the back surface $3_R$ of the target 3. The second magnet loop 7b is located in any case opposite to the back surface $3_R$ of the target 3 with the second magnetic polarity, for instance S. As resulting offhand from FIG. 2c, the realization of the pair of magnet loops $7_{ab}$ is such that along the back surface $3_R$ of the target 3 a circumferential zone of the one magnetic polarity arises as well as a relative to this inside or outside circumferential arranged second zone of the second magnetic polarity. Hereunto at both loops permanent magnets 9 are provided, on the side pointing from the back surface $3_R$ of the target 3 a ferromagnetic connection 10. Alternately in each case, eventually in sections, considered along the magnet loops, on the one e.g. the outer permanent magnets 9a present, and the second magnetic polarity facing to the back surface $3_R$ of the target 3 at the other loop e.g. the inner 7b, is formed by a ferromagnetic yoke.

Considered along the pair 7 the constellations according to FIG. 2c can alternate just as, in view of the realisation with yoke 12, the arrangement of the permanent magnets.

According to the FIG. 2, in particular FIG. 2b, according to the here illustrated embodiment the distance $d_{b1}(t)$ of a part $7_{b1}$ of one of the magnet loops of the pair 7 is changed under control with respect to the back surface $3_R$ of the target 3 by means of a drive 14 controlled at a control input $S_{14}$. In FIG. 2b $d_a$ denotes the distance of the magnetic pole surface of the one magnet loop from the back surface $3_R$ of the target 3, the distance $d_b$ that of the second magnet loop 7b and $d_{b1}$ the controlled alterable distance of the part $7_{b1}$ at at least one of the both loops, e.g. at the inner. The effect of the magnetron magnetic field H formed by the pair $7_{ab}$ is changed controlled. As a matter of course it is absolutely possible at the considered magnet loop to controlled distance-move booth parts relatively to each other and both parts with reference to the back surface $3_R$ of the target 3, i.e. for instance and in view of FIG. 2a, to lift part 7b and to simultaneously lower the remaining part of the considered magnet loop. Essentially is, that, considered along the pair of magnet loops $7_{ab}$, the distance relations of the magnetic pole surfaces are with reference to the back surface $3_R$ of the target 3 changed by controlled distance change at the magnet loops over time.

So it is e.g., as shown in FIG. 2a, a good idea to, in a considered section along the pair $7_{ab}$ at both magnet loops, controlled change equal or unequal long parts $7_{a1}$, $7_{b1}$ with reference to the distance of the back surface $3_R$ of the target 3, in the same direction equal or unequal, or in inverse direction equal or unequal.

In a representation analogous to that of FIG. 2a in FIG. 3 a further good embodiment of the invention is shown. As clearly evident hereby at the pair $7_{ab}$ the distance between the whole pole surface and the target at the one, e.g. the outer magnet loop 7a, $d_a(t)$ is controlled by the drive 14, set over the time and therewith in turn the effect of the generated tunnel shaped magnetic field H. Also here the distance relations of both of the whole magnet loops $7_a$ and $7_b$ can eventually be controlled set in the same direction equal, in same direction unequal in each inverse direction equal or unequal. The embodiment according to FIG. 3 in turn shows a one circuit magnetronsource.

In FIG. 4 a further good embodiment of the invention is shown, in a view analogous to the presentation of FIG. 2b. Here in general an odd number, as shown three, magnet loops $7_a$ to $7_c$ are present which form together two pairs of loops $7_{ab}$ to $7_{bc}$ a of the magnet arrangement 5. The polarity of the medial magnet loop $7_b$ is inverse to that of the both adjacent. Thereby in the shown embodiment the two circumferential loops of the tunnel shaped magnetron magnetic field $H_1$, $H_2$ are formed. Analogous to the embodiments to FIG. 2 in the embodiment according to FIG. 4 the distance $d_{b1}(t)$ of at least of one part $7_{b1}$ of the medial magnet loop $7_{b1}$ is changed by means of a controlled drive (not shown), whereas the or the remaining parts of the considered magnet loop 7b are kept at a constant distance with respect to the back surface $3_R$ of the target 3.

FIG. 5 shows, in a presentation analogous to FIG. 4, a further good embodiment—analogous to that shown in FIG. 3—in which the whole medial magnet loop 7b is, as indicated by $d_b(t)$, changed by means of a controlled drive (not shown) with respect to the to the back surface $3_R$ of the target 3.

In a proceeding according to FIGS. 4 and 5 it is by targeted setting of the distance $d_b(t)$ and $d_{b1}(t)$ respectively basically acted identically on both magnetron magnetic fields $H_1$ and $H_2$.

According to the embodiment according to FIG. 6 as now offhand comprehensible a part $7_{a1}$ of the outer magnet loop 7a is moved with respect to its distance $d_{a1}(t)$ by means of a (not shown) controlled drive, whereas the remaining part of the magnet loop is kept at a constant distance, just as the loops 7b, 7c.

In the likewise good embodiment according to FIG. 7 the distance $d_a(t)$ of the whole outer magnet loop 7a is changed by means of a controlled drive (not shown) and relatively to the back surface $3_R$ of the target 3.

The embodiments according to FIGS. 4 to 7 deal with two circuit magnetronsources. By providing correspondingly controlled drives all individual embodiments described by means of the FIGS. 2 to 7 may be eventually combined employed at a magnetronsource.

Whereas by the distance setting in the embodiments according to the FIGS. 4 to 7, i.e. at two circuit magnetronsources, the adjacent magnetron magnetic fields H are set in mutual dependency namely generally spoken upon weakening of the one field the other is fortified and vice versa, this is less significantly the case in the subsequently discussed good embodiments. In the likewise good embodiment according to FIG. 8 four, more general an even number of magnet loops lying in one another are provided, $7a$ to $7d$. From the innermost or outermost magnet loop, progressing perpendicular thereto, two successive magnet loops are each involved in the forming of a pair of magnet loops, as illustrated in FIG. 8 by $7_{ab}$, $7_{cd}$, which form a magnetron magnetic field, H1 and H2 respectively. At both pairs $7_{ab}$, $7_{cd}$ the embodiments described by means of the FIGS. 2 and 3 can each be realized, at one of the pairs or at both. Additionally however in a further good embodiment of the invention and as shown in FIG. 9 by means of a (not shown) controlled drive the distance $d_c(t)$ of a whole pair of loops, according to FIG. 9 of the inner $7_{cd}$, can be set according to the invention. It is also possible and a good idea to design the distance of both provided pairs of magnet loops controlled adjustable by corresponding drives and to set this distances unidirectional equal, non-unidirectional unequal, in opposite direction equal or in opposite direction unequal, eventually arbitrarily specific combined.

Up to now were, in the embodiments according to the FIGS. 2 to 9, the provided magnet arrangement with the magnet loops, aside from the distance setting according to the invention, considered as stationary with respect to the back surface $3_R$ of the target 3. In all embodiments it is a good concept, in addition to the realization of the distance setting according to the invention, to move at least parts of the magnet arrangement 5 along the back surface $3_R$ of the target 3 by means of a corresponding (not shown) drive. Thus it is a good concept, to move according to FIG. 2a as illustrated schematically by the movement trajectory $B_{ab}$ the pair $7_{ab}$ cyclic along the back surface $3_R$ of the target 3. The same is true in the embodiment according FIG. 3. Thereby it is eventually also a good concept to move at the considered one circuit magnetronsources according to FIGS. 2 and 3 the both magnet loops forming the pair relatively to one another on different movement trajectories along the back surface $3_R$ of the target 3.

In the embodiment according to the FIGS. 4 to 7, i.e. in the realization of a two circuit magnetronsource with magnet loop triples good concepts result by Moving of all provided magnet loops equally along the back surface $3_R$ of the target 3.

Moving the medial magnet loop with respect to the both adjacent magnet loops;

Moving one or both of the outermost and innermost magnet loops of the triple equally or unequally with respect to the medial magnet loop of the triple.

In the embodiments according to the FIGS. 8 and 9 respectively it is a good concept to move all provided pairs of magnet loops equal along the back surface $3_R$ of the target 3, or to move one pair of magnet loops relatively to the other.

Depending on the choice of the concept, to form the magnetron magnetic field by the magnet loops and to move the magnetron magnetic field along the sputter surface $3_S$ of the target 3 respectively the mentioned movement possibilities are combined employed and corresponding controlled drives are provided.

The magnet loops introduced by means of the FIG. 2 to 9 can be arranged circumferential circularly, oval, elliptical or even approximately rectangular, viewed in top view on the sputter surface $3_S$, or can be heart shaped respectively and kidney shaped respectively and meander shaped respectively.

In FIG. 10 a good realization form of a source 20 according to the invention in principal according to FIG. 9 is schematically illustrated. It has a target 23 with a sputter surface $23_S$ and a back surface $23_R$. The outer pair of magnet loops $7_{ab}$ according to FIG. 9 is via a ferromagnetic yoke 10 mounted at an outer supporter 25. By means of a rotation drive 27, only schematically illustrated, the outer supporter 25 is brought into rotation around the axis $A_{25}$. By means of another rotation drive 29 with respect to the only schematically illustrated source housing an inner supporter 35 is brought into rotation, in the shown example around the axis $A_{35}$, which here coincides with the axis of rotation $A_{25}$. The inner supporter 35 has a back panel 33, facing the target 23, of ferromagnetic material and supports the magnet loops $7_c$ and $7_d$, which together form the pair $7_{cd}$. With respect to the axis of rotation $A_{25}$ the pair of magnet loops $7_{ab}$ is concentrically mounted at the outer supporter 25, whereas the pair of magnet loops $7_{cd}$ is mounted at the inner supporter 33 eccentrically with respect to the axis of rotation. By means of a schematically illustrated controllable lift drive 37 the inner supporter 35 is set with respect to the distance $d_{cd}(t)$ to the back surface $23_R$ of the target 23.

The rotation speeds $\omega_{35}$ and $\omega_{25}$ and rotation directions respectively of the outer and inner respectively supporter 25, 35 can thereby be chosen equal or differently.

A good concept results however, if, as illustrated in top view on the magnet arrangement in FIG. 11, the pair of magnet loops $7_{ab}$ is realized at the outer supporter 25 eccentrically and, as shown, e.g. circular, and if the pair of magnet loops $7_{cd}$ at the inner supporter 35 rotating around the axis $A_{35}$ is realized likewise eccentrically.

In FIG. 12 the course (a) at a circular target with diameter 400 mm shows the erosion profile at concentrically arrangement of one of the both pairs of magnet loops, according to FIG. 10 e.g. of the outer $7_{ab}$ and at eccentric arrangement of the other pair of magnet loops, according to FIG. 10 of the pair $7_{cd}$.

The course (b) shows the erosion profile if both, inner and outer pairs $7_{ab}$ and $7_{cd}$, according to FIG. 11 are realized eccentrically with respect to the coinciding rotation axes $A_{25}$, $A_{35}$. It turns out, that in the arrangement according to FIG. 11 in the intermediate area between the inner pair of magnet loops $7_{cd}$ and the outer no significantly diminished eroded area occurs. By optimized eccentricity of the considered pairs of magnet loops an optimal erosions profile cover can be achieved.

In a design according to FIG. 11 it inevitable results that the rotation drives 27 and 29 according to FIG. 10 are operated at same speeds. By the lift, controlled set by the drive 37, and therewith the change of the distance $d_{cd}(t)$ still a more uniform erosion and sputter respectively distribution can, as to be shown, be realised and therewith an optimal desired layer thickness distribution at the substrate can be achieved, or the target utilization can be optimized by preferably uniform deduction of the target surface. The layer thickness distribution achieved at different lifts and in view of FIG. 10 the distance dcd(t), respectively is shown in FIG. 13 at a circular substrate with diameter 300 mm by means of the surface resistance of an on-sputtered cupper layer.

Thus a high resistance value corresponds to a thin layer and vice versa. As magnet arrangement the double eccentric arrangement according to FIG. 11 was employed. The result according to course (a), in which within the central area of the substrate the cupper layer is significantly thinner than in the peripheral area, a lift of the inner pair $7_{cd}$ was set corresponding to the distance $d_{cd}(t)$ according to FIG. 10, which equals the distance $d_a$ of the outer pair $7_{ab}$. Then the distance $d_{cd}(t)$ (inner pair of loops) was reduced by 0.5 mm, which led to an increase of the sputter rate in the central area of the target and therewith to an increase of the coating rate at the substrate, with the result of an according to the course of FIG. 13 significantly improved layer thickness distribution at the substrate. When (not shown in FIG. 13) the lift $d_{cd}(t)$ was reduced by further 0.5 mm, a supreme uniformly layer thickness distribution at the substrate resulted, by in the last coating phase in the centre of the target another time increasing the sputter rate and thereby in the central area of the substrate further increasing the resulting layer thickness, with according to FIG. 13 further reduced surface resistant of the cupper layer in the central area of the substrate.

From FIG. 13 can be seen how by time controlling of the distance at parts of the magnet arrangement generating the magnetic field on the one hand, the course of the sputter rate and therewith the coating rate and therewith the layer thickness distribution at the substrate resulting after a predetermined time can finely be set.

For obtaining the results according to FIG. 13 the discharge voltage at the magnetron sputter source was not influenced and the supplied electrical discharge power was kept constantly.

For the time-dependent controlling of the distance $d_{cd}(t)$ in the arrangement according to FIG. 10 with two eccentric pairs of magnet loop $7_{ab}$ and $7_{cd}$ according to FIG. 11 the following considerations can be helpful, if at the substrate a preferably homogeneous layer thickness distribution shall be achieved, whereby to a person skilled in the art therewith analogous thoughts with respect to differently conceived magnetron-sources according to the invention and distributions to be achieved open up: The erosion profile to be aspired at a circular disc shaped target for optimized layer thickness distribution at the substrate shall at the moment be discussed by means of FIG. 14. Without targeted distance controlling with the arrangement according to FIG. 10 and magnet arrangement according to FIG. 11 an erosion rate ER increased at the outer area results, the erosion rate ER absolutely being desired for the edge effect correction. However in this outer area because of the forming of the significant erosion trench it comes to a higher and higher sputter rate, so that as time goes by, in the outer area of the target, the relative erosion intensity is to be throttled back. This, in order to over the time, achieve a homogeneous layer thickness distribution at the substrate.

Throttling back of the erosion intensity in the outer area is to be considered relatively to the erosion intensity in the central area of the target. Therefore can either the erosion intensity in the outer area of the target be throttled back or the erosion intensity in the central area of the target be encreased. In the explanations to FIG. 13 the lastly mentioned way was described.

Thus it is—in view of FIG. 14—the relative sputter intensity and sputter rate respectively in the outer area of the target to be throttled back from an in the beginning higher value ER1 to a by the end of the coating time lower value ER2.

As a rough approach, how much the distance reduction by $d_{cd}(t)$ of the inner target and the distance reduction the outer supporter respectively shall be, it can be estimated in advance as follows: For the time being at the end of a given coating time, e.g. the target life time, the erosion depth difference between the outer and inner erosion trench is measured. This at predetermined fix distances of the outer and the inner supporter 25 and 35 respectively according to FIG. 10. Once the erosion depth difference is determined, e.g. a 7 mm higher erosion depth in the edge area of the target, than during the same coating time the sputter intensity in the outer area of the target is relatively throttled back by a relative lift change of 7 mm, i.e. a distance increase of the outer supporter 35 by 7 mm and a distance decrease of the inner supporter 25 by 7 mm respectively during the coating time is aspired. The lift change can thereby be performed merely at the outer supporter or merely at the inner supporter or combined oppositely directed at the inner and outer supporter.

The lift change to be led over the time must be performed with high precision and depends on the aspired erosion profile course over the coating time, the target material, the target thickness, the requirements at the substrate demanded with respect to the layer thickness distribution as well as the sputter rate.

For the monitoring and controlling of the controlled distance relations one or several direct or indirect in-situ distance measurements are performed.

In FIG. 10 a sensor arrangement 40 hereto is schematically illustrated. Because in this embodiment the outer supporter is not lift-set, the arrangement measures the instantaneously set distance between the outer supporter 25 and the inner supporter 35 and therewith the course and the instantaneous value respectively of $d_{cd}(t)$. The sensor arrangement 40 can e.g. work on the Principe of triangulation measurement, can be conceived as a capacitive or optical sensor, as mechanical sensor etc. Thereby it is a good idea to employ a contact-free measuring sensor arrangement, so that the magnet arrangement must not be electrically insulated against the target, whereby the distances between the pole surfaces of the magnet arrangement and the back surface of the target can be chosen and set respectively also minimal. Basically with the proceeding according to the invention a desired sputter rate distribution course over the time is adjustable. If consequently e.g. with an arrangement according to FIG. 10 the inner pair of magnet loops $7_{cd}$ is guided along a first target area of a first material, the outer pair of magnet loops $7_{ab}$ however along a target area of a second material, the target consists of two zones of different materials, can by proceeding according to the invention also the relative coating rate of the both materials at the substrate be set.

In FIG. 15 in a presentation analogous to that of FIG. 10 an embodiment is schematically shown, which corresponds in principal to that shown in FIG. 7. Here, too a two circuit magnetronsource is shown. Only the outer magnet loop $7_a$ is set in distance with respect to the two internal positioned magnet loops $7_b$ und $7_c$. The outer magnet loop $7_a$ is mounted fix with respect to the source case 31. The inner pair of magnet loops $7_{cb}$ is, mounted at a rotation driven supporter, eccentrically with respect to the axis of rotation $A_{35a}$. Because of the explanations associated with FIG. 10 the simplified illustrated embodiment according to FIG. 15 is offhand comprehensible to a person skilled in the art.

In FIG. 16 is, with the sputter power as parameter, illustrated the normalised layer thickness distribution at the substrate and over the target lifetime as coating time. The distance of the outer pair of magnet loops $7_{ab}$ according to FIG. 10 is 1 mm larger than the distance of the inner pair of magnet loops $7_{cd}$. The course (a) was measured at a sputter rate of 32 kW, (b) at 28 kW, course (c) at 24 kW, (d) at 16 kW and finally course (d) at 20 kW.

There from a strong dependency of the resulting layer thickness distribution from the set sputter power is discernable. There from follows, that it is a good concept to keep the sputter power constantly when performing the chronologically controlled setting of the distance with respect to the back side of the target of at least one part of the magnet arrangement generating the magnetron field according to the invention.

Furthermore a unique dependency exists between the discharge voltage $U_E$ and the instantaneous sputter rate distribution at the target. Experience shows, that the discharge voltage decreases with increasing target utilization because of the increasing erosion in the outer area of the target.

Thus the possibility arises, to monitore the discharge voltage as measured normal size, to compare it with a target value and by following-up the distance of the outer pair of magnet loops, to keep it constantly in a controlling sense.

Principally the statement results, that the discharge voltage at a multi circuit magnetronsource basically is monitored by the sputter effect of that pair of magnet loops, which causes the highest sputter intensity at the target.

Commonly it is antecedent, with the sputter power as parameter, recorded, how the distance setting according to the invention shall be conducted over the time, in order to achieve within the coating time a desired layer thickness distribution at the substrate. The characteristic curves attained that way are stored in tables. The distance setting is then, depending on the sputter power, conducted according to the stored courses. The controlling of the discharge voltage $U_E$ by setting of the respective distance relation is then performed were appropriate as working point controlling.

In FIG. 17 by means of a schematically signal flow/function block chart a possible concept for the electrical guidance of the magnetronsource according to the invention is illustrated. The magnetronsource 42 has a control input $S_{42}$ for the distance set over the time of at least one part of the magnet arrangement generating the magnetron magnetic field according to the invention. The source is electrically supplied with the adjustable constant power P by a generator 44. The electrical power P set at the operation of a considered target is fed (S.27) to a table storage device 46, wherein for the different power settings the chronological distance functions d(t, P) each determined as required in advance are stored.

From the beginning of the sputter coating with the considered target a time keeper 48 controls the reading of the distance value corresponding to the current coating time out of the table storage device 46. The required distance value is set by the distance control input $S_{42}$.

By the position sensor 40, described e.g. by means of FIG. 10, the accurate retaining of the instantaneously required distance can be controlled. This position control loop is not shown in FIG. 17. Furthermore the discharge voltage $U_E$ is measured as an actual quantity and compared with a predetermined target discharge voltage $U_{SOLL}$ at a comparator 50. The comparison result is as control difference $\Delta$ put by a controller 52 and a superposition unity 54 as setting signal at the input $S_{42}$ of the source 42.

Therewith the working point is by controlling the discharge voltage kept at the predetermined value from table 46.

In FIG. 18 the magnet arrangement 5 of a one circuit magnetronsource is illustrated, with meaner shaped magnet loops $7_a$ and $7_b$. Both magnet loops $7_a$ and $7_b$, the pair $7ab$, rotate around the axis A.

In FIG. 19 the resulting layer thickness distributions at a 300 mm diameter substrate are shown, when, according to course (a), the distance of the loop $7_b$ from the back surface $3_R$ of the target 3 is 2 mm larger than the distance of the outer magnetic circuit $7_a$ and is according to the courses (b), (c), (d) successively reduced by 2 mm. From this it is discernible, that also at a one circuit source and by a proceeding according to the invention at a one circuit source respectively, as shown by means of FIG. 2 and particularly 3, a controlling of the instantaneous sputter rate and therefore of the instantaneous coating rate at the substrate is possible and therewith, over a considered coating time up to the target life time, the setting and the retaining respectively of a desired layer thickness distribution at the substrate, thereby particularly of a homogeneous, i.e. uniformly can be assured.

In view of the embodiment according to FIG. 10 realized according to FIG. 11 it was furthermore asserted, that with this configuration of a two circuit magnetronsource a reduction of the eddy current losses, compared with the one circuit source according to FIG. 18, results, which enables a reduction of the necessary drive engine power for the particular rotating drive by about 20%.

Additionally by the reduction of eddy currents the resulting stray field in the perimeter of the rotating magnet arrangement is reduced and therewith the potentially danger of the perturbation of surrounding construction components is reduced.

The invention claimed is:

1. A method for manufacturing magnetron coated substrates comprising:
providing in a vacuum recipient, a magnetron source comprising a stationary target arrangement with a sputter surface and a planar backside;
providing along the planar backside, a first magnet arrangement generating along said sputter surface a first closed loop of tunnel-shaped magnetron magnetic field eccentrically about an axis perpendicular to said planar backside, said first magnet arrangement having a first outer part and a first inner part, said first outer and first inner parts having pole surfaces extending along and pointing toward said planar backside;
providing along said planar backside, a second magnet arrangement for generating along said sputter surface a second closed loop of tunnel-shaped magnetron magnetic field, said second magnet arrangement having a second outer part and a second inner part, said second outer and second inner parts having pole surfaces extending along and pointing toward said planar backside;
said first magnet arrangement being nested within said second magnet arrangement;
providing a substrate opposite to and spaced from said sputter surface;
rotating said first inner and said first outer parts about said axis relative to said second outer and said second inner parts;
selectively moving only said first magnet arrangement linearly with respect to said second outer and said second inner parts, towards and away from said backside for varying a distance to said planar backside, while leaving positioning of the pole surfaces of said second outer and said second inner parts of said second magnet arrangement unmoved by said linear moving;
and sputter coating said substrate;
wherein said second magnet arrangement rotates independently relative to said first magnet arrangement.

2. The method of claim 1, further comprising generating said first closed loop of tunnel-shaped magnetron magnetic field by said first inner part comprising a loop of magnets and by means of said first outer part comprising a loop of magnets.

3. The method of claim 1, wherein said second magnet arrangement also comprises a second inner loop of magnets.

4. The method of claim 1, wherein said second magnet arrangement comprises a second inner part of said second magnet arrangement.

5. The method of claim 1, wherein said selective moving is controlled depending on operating time of said target arrangement.

6. The method of claim 1, further comprising generating a second closed loop of tunnel-shaped magnetron magnetic field by said second outer part comprising a loop of magnets.

7. The method of claim 1, further comprising generating said second closed loop of tunnel-shaped magnetron magnetic field eccentrically about a further axis perpendicular to said backside and rotating said second closed loop about said further axis.

8. The method of claim 7, wherein said axis and said further axis are the same axes.

9. The method of claim 1, further comprising monitoring a discharge voltage of said magnetron source, comparing said discharge voltage monitored with a desired value for said discharge voltage and performing said varying depending on a result of said comparing.

10. The method of claim 1, further comprising providing said target arrangement of at least two zones of different target materials and controlling a ratio of said different materials deposited on said substrate, and performing said controlling comprising said varying.

* * * * *